(12) United States Patent
Lee et al.

(10) Patent No.: US 9,142,325 B2
(45) Date of Patent: Sep. 22, 2015

(54) SEMICONDUCTOR MEMORY DEVICE FOR PERFORMING REPAIR OPERATION

(71) Applicant: SK hynix Inc., Gyeonggi-do (KR)

(72) Inventors: Doo-Chan Lee, Gyeonggi-do (KR); Byeong-Chan Choi, Gyeonggi-do (KR); One-Gyun Na, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,831

(22) Filed: Dec. 15, 2013

(65) Prior Publication Data
US 2015/0098286 A1    Apr. 9, 2015

(30) Foreign Application Priority Data

Oct. 8, 2013 (KR) ........................ 10-2013-0119722

(51) Int. Cl.
*G11C 7/00* (2006.01)
*G11C 29/00* (2006.01)
*G11C 29/04* (2006.01)

(52) U.S. Cl.
CPC .............. *G11C 29/765* (2013.01); *G11C 29/04* (2013.01)

(58) Field of Classification Search
USPC .................................. 365/200, 230.03, 225.7
See application file for complete search history.

(56) References Cited

U.S. PATENT DOCUMENTS

2010/0284233 A1*  11/2010  Kim et al. ................. 365/200

FOREIGN PATENT DOCUMENTS

| KR | 100859243 | 9/2008 |
|----|-----------|--------|
| KR | 100894099 | 4/2009 |

* cited by examiner

*Primary Examiner* — Hoai V Ho
(74) *Attorney, Agent, or Firm* — IP & T Group LLP

(57) ABSTRACT

A semiconductor memory device includes: a memory cell array region having a plurality of normal cell lines and a plurality of repair cell lines; a plurality of normal cell line selection units suitable for selecting the plurality of normal cell lines, respectively, in response to a local address; a plurality of repair cell line selection units suitable for selecting the plurality of repair cell lines, respectively, in place of normal cell line selection units corresponding to fail information of the local address; a fuse driving unit comprising a fuse array in which the fail information is programmed, suitable for disabling the normal cell line selection units corresponding to the fail information, and enabling normal cell line selection units unrelated to the fail information; and an address determination unit suitable for controlling the plurality of repair cell line selection units based on the fail information.

10 Claims, 7 Drawing Sheets

SEMICONDUCTOR MEMORY DEVICE FOR PERFORMING REPAIR OPERATION

CROSS-REFERENCE TO RELATED APPLICATIONS

The present application claims priority of Korean Patent Application No. 10-2013-0119722, filed on Oct. 8, 2013, which is incorporated herein by reference in its entirety.

BACKGROUND

1. Field

Exemplary embodiments of the present invention relate to a semiconductor design technology, and more particularly, to a semiconductor memory device.

2. Description of the Related Art

Generally, semiconductor memory devices such as a double data rate synchronous dynamic random access memory (DDR SDRAM), have a large number of memory cells. Since the integration degree has increased with the development of process technology, the number of memory cells has further increased. When a fail occurs in any one of the memory cells, a semiconductor memory device having the memory cell must be discarded because the semiconductor memory device cannot perform a desired operation. Recently with the development of the process technology for semiconductor memory devices, a defect occurs only in a small number of memory cells. When a semiconductor memory device is discarded due to such a small number of defects, it is very inefficient in terms of yield. Thus, to solve such a concern, a semiconductor memory device additionally includes redundancy memory cells as well as normal memory cells.

A redundancy memory cell is provided to replace a normal memory cell in which a fail occurred (hereinafter, referred to as a "repair target memory cell"). Specifically, when the repair target memory cell is accessed during a read/write operation, the redundancy memory cell is accessed instead of the repair target memory cell. Thus, when an address corresponding to the repair target memory cell is inputted, the semiconductor memory device performs an operation for accessing the redundancy memory cell instead of the repair target memory cell hereinafter, referred to as a "repair operation"). The repair operation may guarantee a normal operation of the semiconductor memory device.

Generally, a redundancy circuit for the repair operation is provided in each of a plurality of banks included in the semiconductor memory device. The bank includes a cell mat having a plurality of unit cells, a row control region having circuits for controlling a row access, and a column control region having circuits for controlling a column access. The redundancy circuit may include a row redundancy circuit for storing a row address of a unit cell having a defect and a column redundancy circuit for storing a column address of a unit cell having a defect. The row redundancy circuit and the column redundancy circuit are included in the row control region and the column control region of the bank, respectively.

FIG. 1 is a block diagram illustrating a conventional semiconductor memory device for describing a repair operation of a row control region.

Referring to FIG. 1, the semiconductor memory device 100 includes a normal mat 110, a repair mat 120, an address latch unit 130, a normal word line selection unit 140, a repair word line selection unit 150, and a mat selection unit 160.

When an active command (not illustrated) is applied to the semiconductor memory device 100, a row address XADD applied from outside is compared with a fail address stored in the address latch unit 130, and a first repair word line select signal XHIT0 is generated when the row address XADD coincides with the fail address. The address latch unit 130 may include a plurality of latches 130_1 to 130_N that may compare the row address XADD with the fail address and generate a plurality of repair word line select signals. The address latch unit 130 may activate a first control signal NXKILL when all of the repair word line select signals are activated. At this tune, the activated first control signal NXKILL is transmitted to the mat selection unit 160 to deactivate a mat select signal MATENB. Thus, in response to the deactivated mat select signal MATENB, the normal word line selection unit 140 does not perform a word line decoding operation for selecting a normal word line within the normal mat 110, and the repair word line selection unit 150 performs a word line decoding operation for selecting a repair word line within the repair mat 120. The first repair word line select signal XHIT0 is transmitted to the mat selection unit 160 and the repair word line selection unit 150. That is, after the first control signal NKKILL which is used to determine whether the row address XADD applied from outside is identical to the fail address or not is generated, the mat selection unit 160 may operate in response to a bank select signal BKSEL. Therefore, tRCD (Row to Column Access Strobe Delay "RAS to CAS Delay") and tAA (Column Address Access Time) are delayed by a delay time of the first control signal NXKILL and the bank select signal BKSEL.

Although not illustrated, a column control region is configured in a similar manner to the row control region. That is, fail information F_DATA is stored in an address latch unit, and then compared with a column address inputted from outside so as to generate a plurality of signals, and the plurality of signals are used to generate a second control signal. When the column address coincides with the fail information F_DATA, the second control signal does not operate a normal column line selection unit for generating a column select signal. Similar to the row control region, after the second control signal is generated, which is used to determine whether or not the column address is identical to the fail information F_DATA, the mat selection unit may operate in response to a strobe signal. Thus, a delay time of the second control signal and the strobe signal inevitably occurs.

FIG. 2 is a timing diagram describing a repair operation of the conventional semiconductor memory device.

Referring to FIG. 2, when an address A applied after an active command ACT is identical to a fail address, the first control signal NXKILL is generated to determine whether or not a repair operation is required. Then, a repair word line Red.WL is activated in response to the bank select signal BKSEL to be applied afterwards. When an address B applied after a read command RD or write command WT is identical to a fail address, the second control signal NYKILL is generated to determine whether or not a repair operation is required. Then, a repair column select signal Red.YI is activated in response to the strobe signal STROBE to be applied afterwards. Thus, tRCD and tAA are delayed by a delay time t1 between the first control signal NXKILL and the bank select signal BKSEL and a delay time t2 between the second control signal NYKILL and the strobe signal STROBE.

SUMMARY

Various exemplary embodiments are directed to a semiconductor memory device which advances an enable time of a repair cell line for a repair operation using a fuse array, thereby improving tRCD (RAS to CAS Delay) and tAA (a column address access time).

In an exemplary embodiment, a semiconductor memory device may include: a memory cell array region having a plurality of normal cell lines and a plurality of repair cell lines; a plurality of normal cell line selection units suitable for selecting the plurality of normal cell lines, respectively, in response to a local address; a plurality of repair cell line selection units suitable for selecting the plurality of repair cell lines, respectively, in place of normal cell line selection units corresponding to fail information of the local address among the plurality of normal cell line selection units; a fuse driving unit having a fuse array in which the fail information is programmed, suitable for disabling the normal cell line selection units corresponding to the fail information, and enabling normal cell line selection units unrelated to the fail information; and an address determination unit suitable for controlling the plurality of repair cell line selection units based on the fail information programmed in the fuse array.

In an exemplary embodiment, a semiconductor memory device may include: a plurality of normal mats determined to be selected by a plurality of normal main word lines, respectively; a plurality of repair mats determined to be selected by a plurality of repair main word lines, respectively; a plurality of normal main word line selection units suitable for selecting the plurality of normal main word lines, respectively, in response to a local row address; a plurality of repair main word line selection units suitable for selecting the plurality of repair main word lines, respectively, in place of normal main word line selection units corresponding to fail information of the local row address among the plurality of normal main word line selection units; a fuse driving unit comprising a fuse array in which the fail information is programmed, suitable for disabling the normal main word line selection units corresponding to the fail information, and enabling normal main word line selection units unrelated to the fail information; and an address determination unit suitable for controlling the plurality of repair main word line selection units based on the fail information programmed in the fuse array.

In an exemplary embodiment, a semiconductor memory device may include: a memory cell array region having a plurality of normal column lines and a plurality of repair column lines; a plurality of normal column line selection units suitable for selecting the plurality of normal column lines, respectively, in response to a local column address; a plurality of repair column line selection units suitable for selecting the plurality of repair column lines, respectively, in place of normal column line selection units corresponding to fail information of the local column address among the plurality of normal column line selection units; a fuse driving unit comprising a fuse array in which the fail information is programmed, suitable for disabling the normal column line selection units corresponding to the fail information, and enabling normal column line selection units unrelated to the fail information; and an address determination unit suitable for controlling the plurality of repair column line selection units based on the fail information programmed in the fuse array.

DETAILED DESCRIPTION

Figure 1:
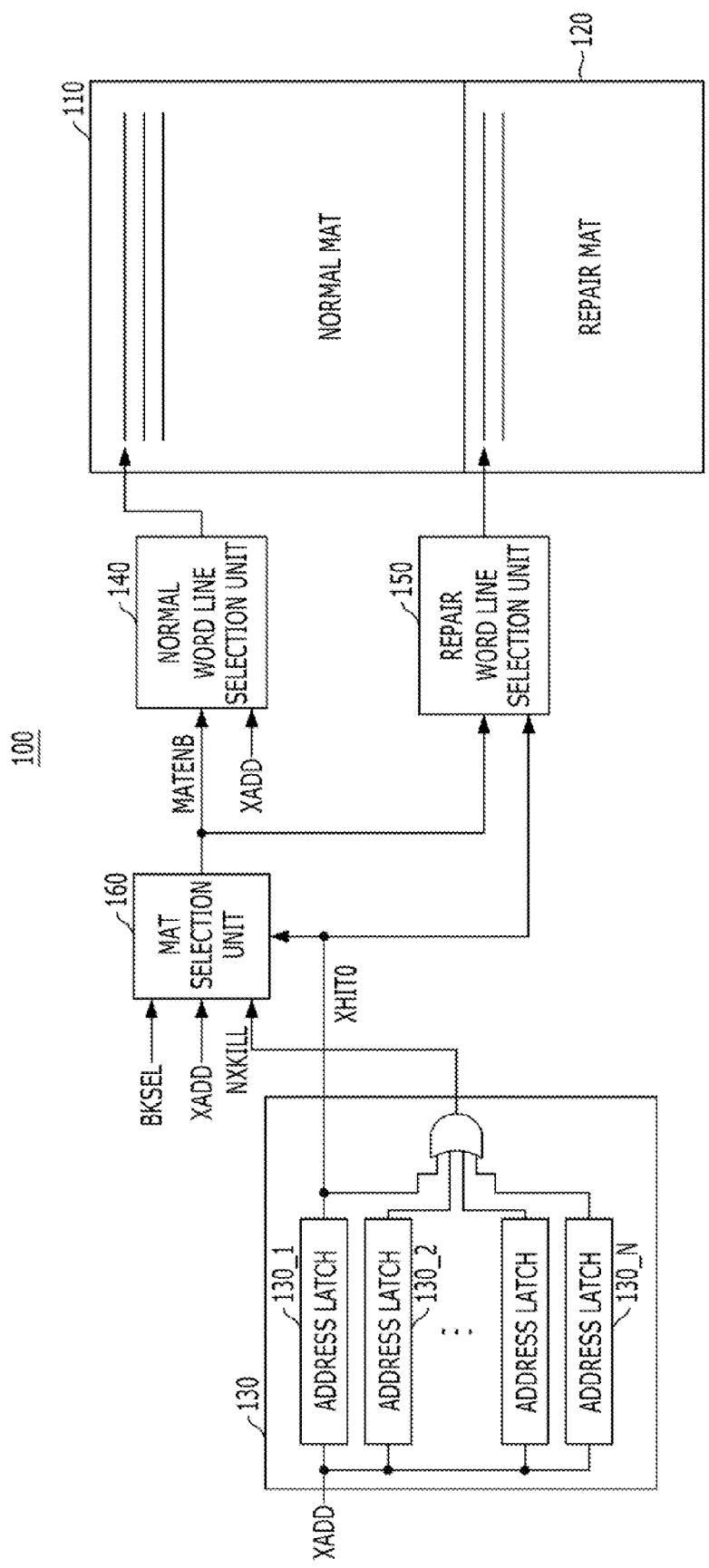
FIG. 1 is a block diagram illustrating a conventional semiconductor memory device for describing a repair operation of a row control region.
Figure 2:
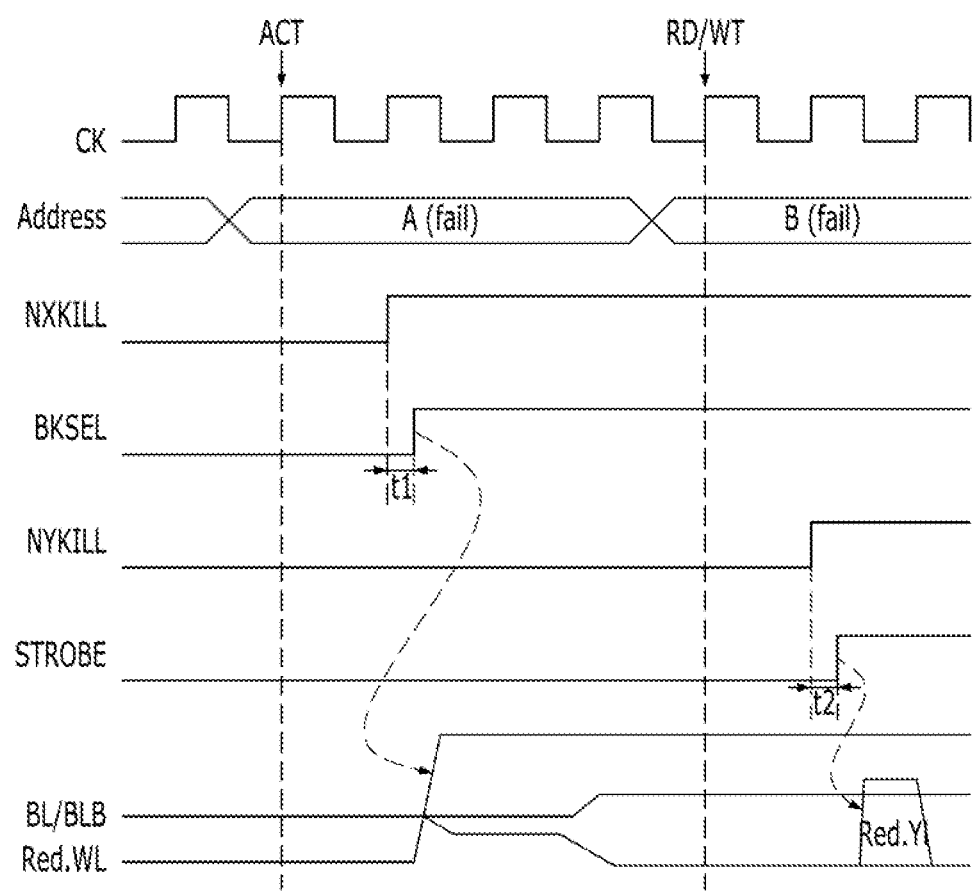
FIG. 2 is a timing diagram describing a repair operation of the conventional semiconductor memory device.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
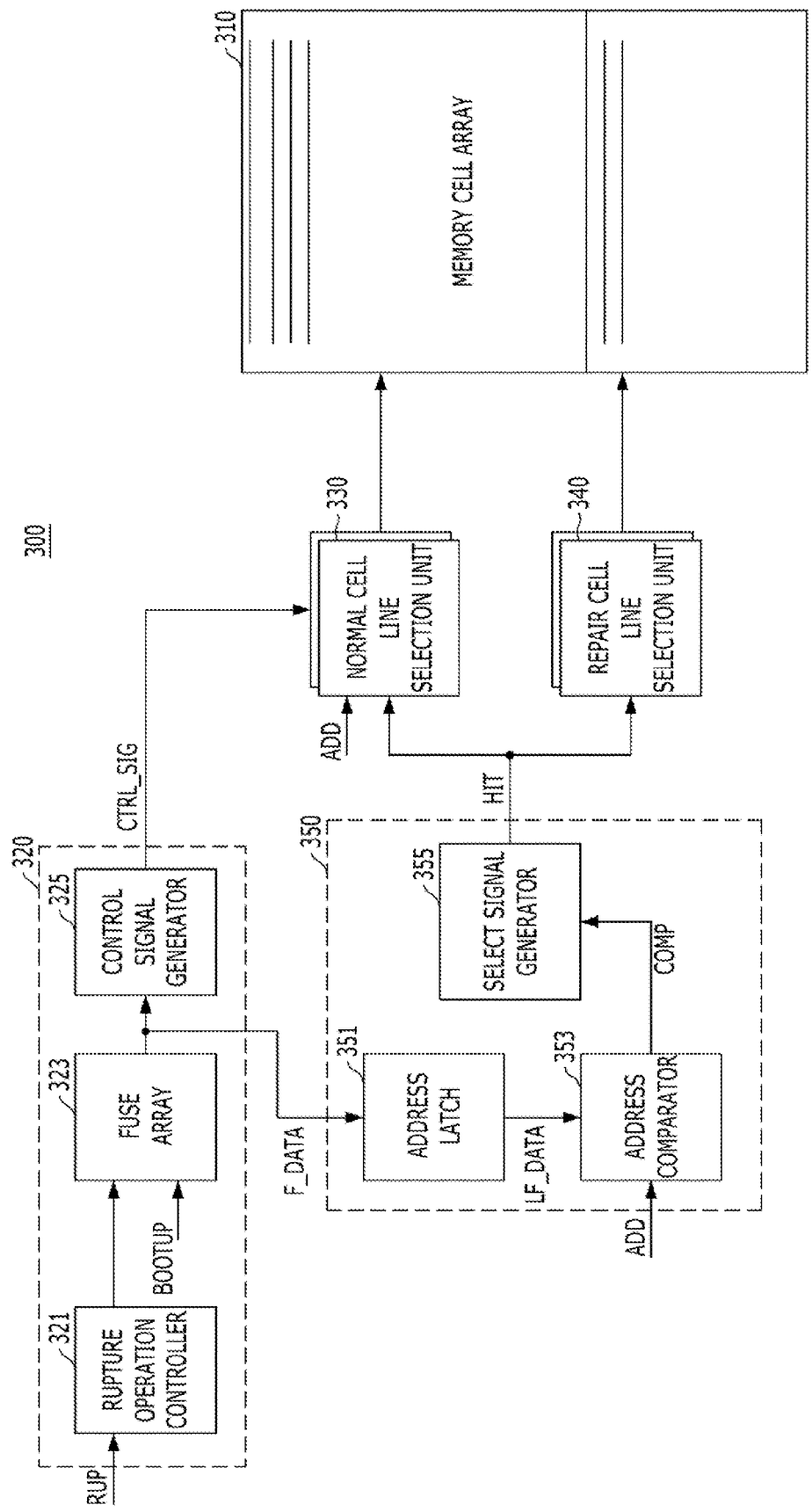
FIG. 3 is a block diagram illustrating a semiconductor memory device in accordance with a first embodiment of the present invention.

FIG. 3 is a block diagram illustrating a semiconductor memory device in accordance with a first embodiment of the present invention.

Referring to FIG. 3, the semiconductor memory device 300 in accordance with the first embodiment of the present invention includes a memory cell array region 310, a fuse driving unit 320, a plurality of normal cell line selection units 330, a plurality of repair cell line selection units 340, and an address determination unit 350. The fuse driving unit 320 includes a rupture operation controller 321, a fuse array 323, and a control signal generator 325. Furthermore, the address determination unit 350 includes an address latch 351, an address comparator 353, and a select signal generator 355.

The memory cell array region 310 includes a plurality of normal cell lines and a plurality of repair cell lines. The plurality of normal cell line selection units 330 select and drive the plurality of normal cell lines within the memory cell array region 310 in response to a local address ADD, and the plurality of repair cell line selection units 340 select and drive the plurality of repair cell lines. The plurality of repair cell line selection units 340 select the plurality of repair cell lines, instead of normal cell line selection units corresponding to fail information F_DATA of the local address ADD among the plurality of normal cell line selection units 330.

Furthermore, among the components of the fuse driving unit 320, the rupture operation controller 321 performs a rupture operation on the fuse array 323 in response to a rupture signal RUP applied when the semiconductor memory device 300 is booted. That is, the fail information F_DATA is programmed into the fuse array 323 through the rupture operation of the rupture operation controller 321. Then, as a boot-up signal BOOTUP is applied to the fuse array 323, a boot-up operation is performed. As a result, the fail information F_DATA programmed in the fuse array 323 is transferred to the address latch 351. After the boot-up operation, the control signal generator 325 generates a control signal CTRL_SIG for selectively controlling whether to enable and disable the plurality of cell line selection units 330 in response to the fail information F_DATA programmed in the fuse array 323. At this time, when the plurality of normal cell line selection units 330 is enabled, it may indicate that an operation of selecting and driving the normal cell lines is performed when the local address ADD is applied. Furthermore, when the plurality of normal cell line selection units 330 are disabled, it may indicate that an operation of selecting and driving the normal cell lines is not performed regardless of the local address ADD. Thus, among the plurality of normal cell line selection units 330, normal cell line selection units corresponding to the fail information F_DATA are disabled in response to the control signal CTRL_SIG. Furthermore, normal cell line selection units unrelated to the fail information F_DATA are enabled in response to the control signal CTRL_SIG.

The address latch 351 of the address determination unit 350 receives the fail information F_DATA programmed in the fuse array 323 within the fuse driving unit 320 and latches the received fail information F_DATA as latched fail information LF_DATA during the boot-up operation. When a command is applied from a memory controller (not illustrated), the address comparator 353 compares the local address ADD inputted from outside with the latched fail information LF_DATA, and outputs a comparison result COMP. Based on the comparison result COMP, the select signal generator 355 generates a repair select signal HIT. The repair select signal HIT is used to control the plurality of repair cell line selection units 340 to select the repair cell lines, depending on whether or not the local address ADD coincides with the latched fail information LF DATA.

Therefore, the fuse driving unit 320 may recognize which of the normal cell line selection units 330 is selected based on the fail information F_DATA programmed in the fuse array 323 during the boot-up operation. That is, the control signal generator 325 generates the control signal CTRL_SIG having a low level to disable normal cell line selection units selected by the fail information F_DATA among the plurality of normal cell line selection units 330. The control signal generator 325 generates the control signal CTRL_SIG having a high level to enable normal cell line selection units which are not selected by the fail information F_DATA among the plurality of normal cell line selection units 330. For reference, the low and high levels may be changed by a designer.

Specifically, an operating method of the semiconductor memory device 300 will be described as follows.

First, during a boot-up operation, fail information F_DATA is transferred to the address latch 351 from the fuse array 323 in which the fail information F_DATA is programmed. At this time, while the fail information F_DATA is latched as latched fail information LF_DATA in the address latch 351, the control signal generator 325 outputs a control signal CTRL_SIG to enable and disable the plurality of normal cell line selection units 330 in response to the fail information F_DATA stored in the fuse array 323. Thus, among the plurality of normal cell line selection units 330, normal cell selection line units corresponding to the fail information F_DATA stored in the fuse array 323 are disabled in response to the control signal CTRL_SIG, and normal cell line selection units unrelated to the fail information F_DATA are enabled in response to the control signal CTRL_SIG.

Then, when a command (not illustrated) for data input/output is applied from a memory controller (not illustrated), a local address ADD is inputted from outside. The address comparator 353 compares the local address ADD with the latched fail information LF_DATA latched in the address latch 351, and determines whether or not the local address ADD is identical to the latched fail information LF_DATA. When the local address ADD coincides with the latched fail information LF_DATA, the select signal generator 355 generates a repair select signal HIT for controlling an operation of selecting a plurality of repair cell lines. At this time, since the normal cell line selection units corresponding to the fail information F_DATA are disabled in response to the control signal CTRL_SIG, the repair cell line selection units 340 are driven immediately at the time at which the repair select signal HIT is generated. When the local address ADD does not coincide with the latched fail information LF_DATA, the repair select signal HIT is deactivated. At this time, the normal cell line selection units which do not correspond to the fail information F_DATA are enabled in response to the control signal CTRL_SIG. Thus, the normal cell line selection units 330 are driven to select the normal cell lines in response to the local address ADD.

In the semiconductor memory device 300 in accordance with the first embodiment of the present invention, the fuse driving unit 320 having the fail information F_DATA programmed therein may control the drive of the plurality of normal cell line selection units 330. Thus, the semiconductor memory device 300 may determine whether or not the local address ADD applied from outside after a command is identical to a fail address, and may perform a repair operation immediately when the repair select signal HIT is activated. Therefore, it is possible to reduce the time required for the repair operation.

Figure 4:
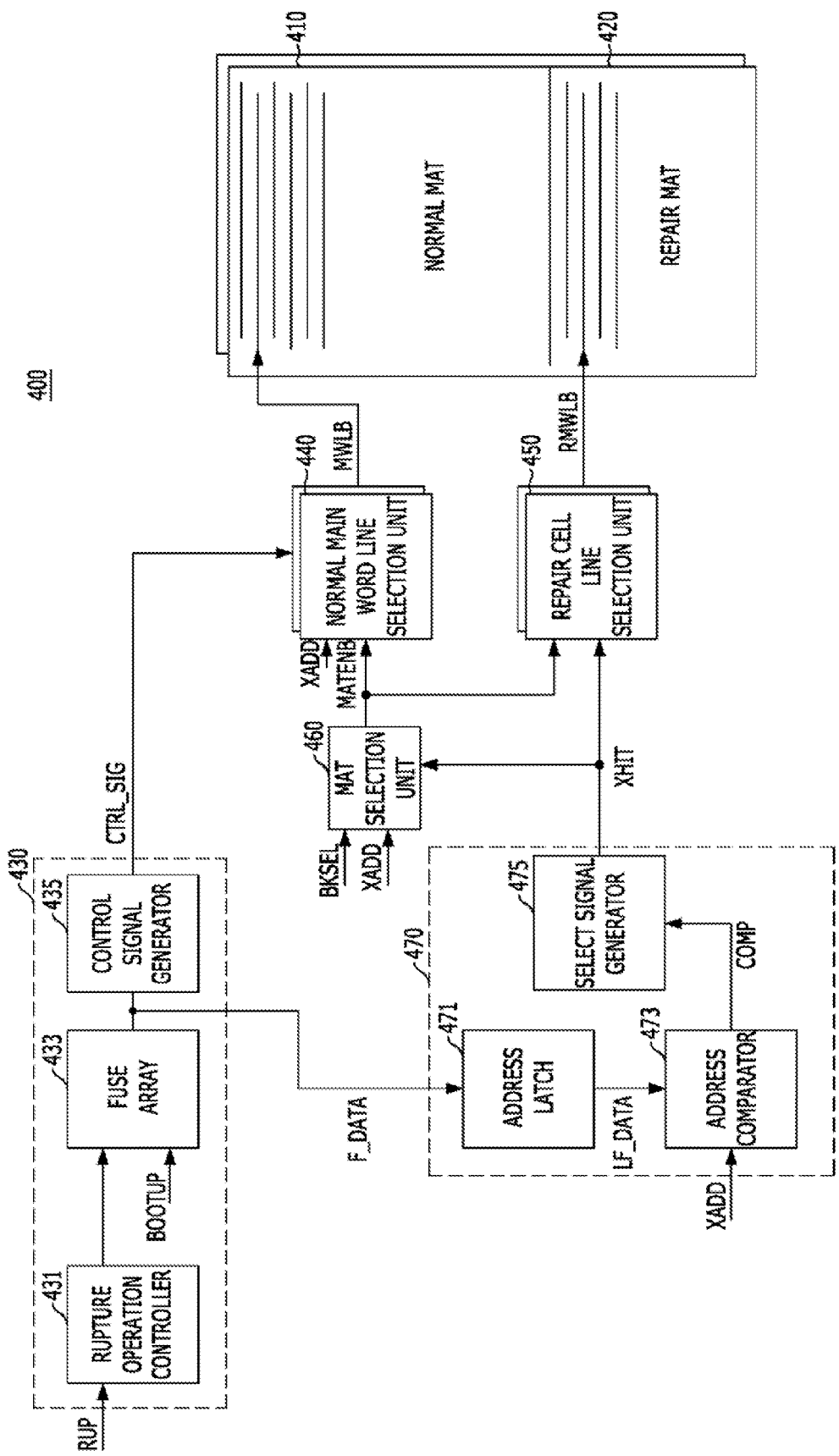
FIG. 4 is a block diagram illustrating a semiconductor memory device in accordance with a second embodiment of the present invention.

FIG. 4 is a block diagram illustrating a semiconductor memory device in accordance with a second embodiment of the present invention.

Referring to FIG. 4, the semiconductor memory device 400 in accordance with the second embodiment of the present invention includes a plurality of normal mats 410, a plurality of repair mats 420, a fuse driving unit 430, a plurality of normal main word line selection units 440, a plurality of repair main word line selection units 450, a mat selection unit 460, and an address determination unit 470. The fuse driving unit 430 includes a rupture operation controller 431, a fuse array 433, and a control signal generator 435. The address determination unit 470 includes an address latch 471, an address comparator 473 and a select signal generator 475.

The plurality of normal mats 410 are selected by a plurality of normal main word lines, respectively, and the plurality of repair mats 420 are selected by a plurality of repair main word lines, respectively. For reference, although not illustrated, each of the normal mats includes a normal main word line and a plurality of sub word lines corresponding to the normal main word line. The word lines within the normal mat are controlled by sub word line driving units (not shown) arranged in the mat region. The sub word line driving unit determines whether to enable or disable a sub word line signal according to a normal main word line signal MWLB outputted from the normal main word line selection unit 440 and a sub word line driving signal. For example, when the sub word line driving signal and the normal main word line signal MWLB are enabled during an active operation, the sub word line signal is enabled.

The plurality of normal main word line selection units 440 select the plurality of normal main word lines respectively, in response to a local row address XADD. The local row address XADD is an address for selecting normal main word lines corresponding to the respective normal mats 410.

Furthermore, the plurality of repair main word line selection units 450 select the plurality of repair main word lines, instead of normal main word line selection units corresponding to fail information F_DATA of the local row address XADD, respectively, among the plurality of normal main word line selection units 440.

Among the components of the fuse driving unit 430, the rupture operation controller 431 performs a rupture operation on the fuse array 433 in response to a rupture signal RUP that is applied when the semiconductor memory device 400 is booted. Through the rupture operation of the rupture operation controller 431, the fail information F_DATA is programmed into the fuse array 433. Then, as a boot-up signal BOOTUP is applied to the fuse array 433, a boot-up operation is performed. As a result, the fail information F_DATA programmed in the fuse array 433 is transferred to the address latch 471. After the boot-up operation, the control signal generator 435 generates a control signal CTRL_SIG for selectively controlling whether to enable and disable the plurality of normal main word line selection units 440 in response to the fail information F_DATA programmed in the fuse array 433. As described above, when the plurality of normal main word line selection units 440 are enabled, it may indicate that an operation of selecting and driving normal main word lines is performed when the local row address XADD is applied. Furthermore, when the plurality of normal main word line selection units 440 are disabled, it may indicate that an operation of selecting and driving normal main word lines is not performed regardless of the local row address XADD. Thus, among the plurality of normal main word line selection units 440, normal main word line selection units corresponding to the fail information F_DATA are disabled in response to the control signal CTRL_SIG. Furthermore, normal main word line selection units unrelated to the fail information F_DATA are enabled in response to the control signal CTRL_SIG.

The address latch 471 of the address determination unit 470 receives the fail information F_DATA programmed in the fuse array 433 within the fuse driving unit 430 and latches the received information as latched fail information LF_DATA during the boot-up operation. When an active command (not illustrated) is applied, the address comparator 473 compares a local row address XADD inputted from outside with the latched fail information LF_DATA, and outputs a comparison result COMP. Based on the comparison result COMP, the select signal generator 475 generates a repair word line select signal XHIT. The repair word line select signal XHIT is used to control the plurality of repair main word line selection units 450 to select repair main word lines depending on whether or the local row address XADD coincides with the latched fail information LF_DATA.

As described above, the fuse driving unit 430 may recognize which of the normal main word line selection units 440 is selected by the fail information F_DATA programmed in the fuse array 433 during the boot-up operation. That is, the control signal generator 435 generates the control signal CTRL_SIG having a low level to disable normal main word line selection units selected by the fail information F_DATA among the plurality of normal main word line selection units 440. The control signal generator 435 generates the control signal CTRL_SIG having a high level to enable normal main word line selection units which are not selected by the fail information F_DATA, among the plurality of normal main word line selection units 440. For reference, high and low levels may be changed by a designer.

The mat selection unit 460 controls whether or not to drive the normal main word line selection units 440 and the repair word line word line selection units 450 in response to the repair word line select signal XHIT, a bank select signal BKSEL, and the local low address XADD. For this operation, the mat selection unit 460 generates a mat select signal MATENB in response to the bank select signal BKSEL and the repair main word line select signal XHIT. The mat select signal MATENB is a control signal for driving the normal main word line selection units 440 and the repair main word line selection units 450. When the mat select signal MATENB is deactivated in response to the repair main word line select signal XHIT, normal main word line selection units unrelated to the fail information F_DATA are driven, and when the mat select signal MATENB is activated, normal main word line selection units corresponding to the fail information F_DATA are driven. For reference, the number of address latches 471 may be set to correspond to the numbers of normal mats 410 and repair mats 420. Thus, a plurality of repair word line select signals may be outputted. The plurality of repair word line select signals is applied to the corresponding mat selection units 460, respectively.

Specifically, an operation of the semiconductor memory device 400 in accordance with the second embodiment of the present invention will be described as follows.

First, during a boot-up operation, fail information F_DATA is transferred to the address latch 471 from the fuse array 433 in which the fail information F_DATA is programmed. At this time, while the fail information F_DATA is latched as latched fail information LF_DATA in the address latch 471, the control signal generator 435 outputs a control signal CTRL_SIG to enable and disable the plurality of normal main word line selection units 440 in response to the fail information F_DATA stored in the fuse array 433. Thus, among the plurality of normal main word line selection units 440, normal main word line selection units corresponding to the fail information F_DATA stored in the fuse array 433 are disabled in response to the control signal CTRL_SIG, and normal main word line selection units unrelated to the fail information F_DATA are enabled in response to the control signal CTRL_SIG.

Then, an active command (not illustrated) for data input/output is applied from a memory controller (not illustrated) and a local row address XADD is inputted from outside. The address comparator 473 compares the local low address XADD with the latched fail information LF_DATA latched in the address latch 471, and determines whether or not the local row address XADD is identical to the latched fail information LF_DATA. When the local row address XADD does not coincide with the latched fail information LF_DATA, the repair word line select signal XHIT is deactivated. Then, the mat select signal MATENB is transferred to the normal main word line selection units 440 and the repair main word line selection units 450 in response to a bank select signal BKSEL. The repair main word line selection units 450 are not driven since the repair word line select signal XHIT is deactivated, and the normal main word line selection units 440 are enabled by the control signal CTRL_SIG outputted from the fuse driving unit 430. Thus, the normal main word line selection units 440 are driven in response to the mat select signal MATENB, and the normal main word line signal MWLB is activated.

When the local row address XADD coincides with the latched fail information LF_DATA, the repair main word line selection units 450 are driven by the repair word line select signal XHIT since the normal main word line selection units 440 corresponding to the fail information F_DATA are disabled. Thus, the repair main word line selection units 450 are driven, and a repair main word line signal RMWLB is activated.

As described above, the semiconductor memory device 400 includes a plurality of sub word lines corresponding to one main word line in each of the normal mats 410. In the semiconductor memory device 400 in accordance with the second embodiment of the present invention, a repair operation is performed on a repair mat including sub word lines in which a fail occurred, when the fail occurred in a part of the plurality of sub word lines provided in one normal mat 410.

Figure 5:
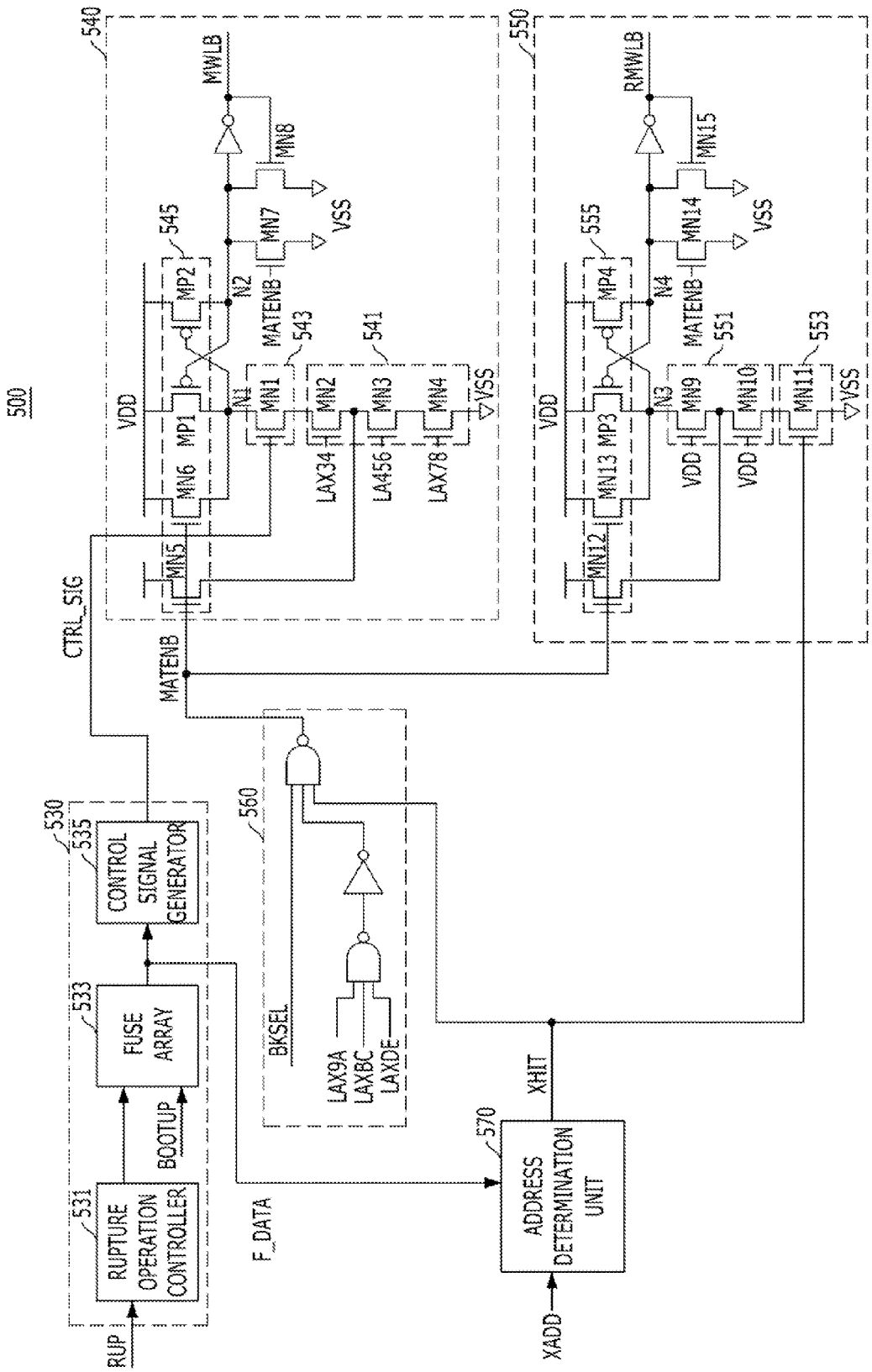
FIG. 5 is a detailed circuit diagram illustrating a semiconductor memory device of FIG. 4.

Referring to FIG. 5 which is a detailed circuit diagram of the semiconductor memory device 400, the operation of the semiconductor memory device 400 will be described.

FIG. 5 is a detailed circuit diagram illustrating a semiconductor memory device of FIG. 4.

Referring to FIG. 5, the semiconductor memory device 500 includes a fuse driving unit 530, a normal main word line selection unit 540, a repair main word line selection unit 550, a mat selection unit 560, and an address determination unit 570. The fuse driving unit 530 includes a rupture operation controller 531, a fuse array 533, and a control signal generator 535. FIG. 5 illustrates detailed circuits of the normal main word line selection unit 540, the repair main word line selection unit 550, and the mat selection unit 560. The normal main word line selection unit 540 includes a normal current sink 541, a normal sink controller 543, and a normal current source 545. The repair main word line selection unit 550 includes a repair current sink 551, a repair sink controller 553, and a repair current source 555.

Among the components of the fuse driving unit 530, the rupture operation controller 531 performs a rupture operation on the fuse array 533 in response to a rupture signal RUP applied when the semiconductor memory device 500 is booted. That is, fail information F_DATA is programmed into the fuse array 533 through the rupture operation of the rupture operation controller 531. Then, as a boot-up signal BOOTUP is applied to the fuse array 533, a boot-up operation is performed. As a result, the fail information F_DATA programmed in the fuse array 533 is transferred to the address determination unit 570. Among the components of the fuse driving unit 530, the control signal generator 535 generates a control signal CTRL_SIG based on the fail information F_DATA programmed in the fuse array 533. The control signal CTRL_SIG is applied to the normal main word line selection unit 540. A local row address XADD applied from outside after an active command (not illustrated) is applied to the address determination unit 570. The address determination unit 570 compares the local row address XADD with the fail information F_DATA so as to generate a repair word line select signal XHIT. The repair word line select signal XHIT is applied to the mat selection unit 560 and the repair main word line selection unit 550.

The mat selection unit 560 receives local row addresses LAX9A, LAXBC, and LAXDE, the bank select signal BKSEL, and the repair word line select signal XHIT, and generates the mat select signal MATENB. The local row addresses LAX9A, LAXBC, and LAXDE are addresses obtained by decoding mat information for selecting a mat. Thus, the mat selection unit 560 outputs the mat select signal MATENB having a high or low logic level in response to the repair word line select signal XHIT outputted from the address determination unit 570.

When an active command (not illustrated) is applied and the local row address XADD inputted from outside is not identical to the fail information F_DATA, the repair word line select signal XHIT having a low logic level is outputted to the mat selection unit 560 and the repair main word line selection unit 550. Regardless of logic values of the local row addresses LAX9A, LAXBC, and LAXDE having mat information for selecting a mat from the local row address XADD, and the bank select signal BKSEL generated in a predetermined time after the active command is applied, the mat selection unit 560 outputs the mat select signal MATENB having a high logic level in response to the repair word line select signal XHIT having a low logic level. The mat select signal MATENB having a high logic level is applied to the normal main word line selection unit 540 and the repair main word line selection unit 550. At this time, the mat select signal MATENB is applied to a corresponding mat according to information decoded in the local row addresses LAX9A, LAXBC, and LAXDE having mat information among the plurality of normal main word line selection units and the plurality of repair main word line selection units.

Hereinafter, configurations of the normal main word line selection unit 540 and the repair main word line selection unit 550 will be described.

The normal main word line selection unit 540 and the repair main word line selection unit 550 are configured in a current mirror type.

The normal current sink 541 within the normal main word line selection unit 540 performs a current sinking operation for selecting a corresponding normal main word line in response to the local row address XADD, between the normal main word line, i.e., a normal main word line signal (MWLB) output node, and a ground voltage VSS. Furthermore, the normal sink controller 543 receives the control signal CTRL_SIG and controls the sinking operation of the normal current sink 541. The normal current source 545 supplies a current to the normal current sink 541 and the normal sink controller 543 in response to the mat select signal MATENB, between a power supply voltage VDD and the normal main word line.

The repair current sink 551 within the repair main word line selection unit 550 receives the power supply voltage VDD and performs a current sinking operation, between a repair main word line, i.e., a repair main word line signal (RMWLB) output node, and the ground voltage VSS. Furthermore, the repair sink controller 533 controls the sinking operation of the repair current sink controller 551 in response to the repair word line select signal XHIT. Furthermore, the repair current source 555 supplies a current to the repair current sink 551 and the repair sink controller 553 in response to the mat select signal MATENB, between the power supply voltage VDD and the repair main word line.

Specifically, the normal sink controller 543 of the normal main word line selection unit 540 includes a first n-channel metal-oxide semiconductor "NMOS" transistor MN1 having a gate receiving the control signal CTRL_SIG outputted from the fuse driving unit 530. The normal current sink 541 includes a second NMOS transistor MN2 connected to the first NMOS transistor MN1 and having a gate receiving a specific local low address LAX34, a third NMOS transistor MN3 having a gate receiving a specific local row address LAX56, and a fourth NMOS transistor MN4 having a gate receiving a specific local row address LAX78. The normal current source 545 includes fifth and sixth NMOS transistors MN5 and MN6, each having a gate receiving the mat select signal MATENB, a first p-type metal-oxide semiconductor "PMOS" transistor MP1 having a source-drain path between the power supply voltage VDD and a first node N1, and a second PMOS transistor MP2 having a source-drain path between the power supply voltage VDD and a second node N2. At this time, the fifth NMOS transistor MN5 has a drain-source path between the power supply voltage VDD and a common node of the second and third NMOS transistors MN2 and MN3. Furthermore, a source of the sixth NMOS transistor MN6 and a drain of the first NMOS transistor MN1 are connected to the first node N1. The first PMOS transistor MP1 has a gate connected to the second node N2, and the second PMOS transistor MP2 has a gate connected to the first node N1.

The normal main word line selection unit 540 further includes a seventh NMOS transistor MN7 having a drain-source path between the second node N2 and the ground voltage VSS and a gate receiving the mat select signal MATENB, and an eighth NMOS transistor MN8 having a drain-source path between the second node N2 and the ground voltage VSS and a gate receiving an output signal passing through an inverter from the second node N. For reference, the local row addresses LAX34, LAX56, and LAX78 are addresses obtained by decoding information for driving word lines within a mat from the local row address XADD applied from outside.

The repair main word line selection unit 550 is configured in a current mirror type, like the normal main word line selection unit 540.

Specifically, the repair current sink 551 within the repair main word line selection unit 550 includes a ninth NMOS transistor MN9 having a gate receiving the power supply voltage VDD, and a tenth NMOS transistor MN10 having a gate receiving the power supply voltage VDD. Furthermore, the repair sink controller 553 includes an 11th NMOS transistor MN11 having a gate receiving the repair word line select signal XHIT outputted from the address determination unit 570. The repair current source 555 includes 12th and 13th NMOS transistors MN12 and MN13 having a gate receiving the mat select signal MATENB, a third PMOS transistor MP3 having a source-drain path between the power supply voltage VDD and a third node N3, and a fourth PMOS transistor MP4 having a source-drain path between the power supply voltage VDD and a fourth node N4. At this time, the 12th NMOS transistor has a drain-source path between the power supply voltage VDD and a common node of the ninth and tenth NMOS transistors MN9 and MN10. Furthermore a source of the 13th NMOS transistor MN13 and a drain of the ninth NMOS transistor MN9 are connected to the third node N3. The third PMOS transistor MP3 has a gate connected to the fourth node N4, and the fourth PMOS transistor MP4 has a gate connected to the third node N3.

The repair main word line selection unit 550 further includes a 14th NMOS transistor MN14 having a drain-source path between the fourth node N4 and the ground voltage VSS and a gate receiving the mat select signal MATENB, and a 15th NMOS transistor MN15 having a drain-source path between the fourth node N4 and the ground voltage VSS and a gate receiving an output signal passing through an inverter from the fourth node N4.

The sinking timing of the repair current sink 551 is synchronized with the sinking timing of the normal current sink 541.

The control signal generator 535 generates the control signal CTRL_SIG for controlling normal main word line selection units corresponding to the fail information F_DATA programmed in the fuse array 533. That is, the control signal CTRL_SIG having a low logic level is outputted to normal main word line selection units corresponding to the fail information F_DATA, and the control signal CTRL_SIG having a high logic level is outputted to the other normal main word line selection units. For reference, the rupture operation controller 531 programs the fail information F_DATA into the fuse array 533 based on local addresses LAX34, LAX56, LAX78, LAX9A, LAXBC, and LAXDE obtained by decoding an existing row address. Thus, the fuse array 533 does not need to be provided for each mat, and an additional area is not required. That is, the existing address decoding logic of the normal main word line selection unit 540 may be utilized to rupture the fail information F_DATA in the fuse array 533.

Hereinafter, an operation of the semiconductor memory device 500 will be described.

First, fail information F_DATA is ruptured and programmed into the fuse array 533 of the fuse driving unit 530.

Among the components of the fuse driving unit 530, the rupture operation controller 531 performs a rupture operation on the fuse array 533 in response to a rupture signal RUP applied when the semiconductor memory device 500 is booted. That is, through the rupture operation of the rupture operation controller 531, the fail information F_DATA is programmed into the fuse array 533. Then, as a boot-up signal BOOTUP is applied to the fuse array 533, a boot-up operation is performed. As a result, the fail information F_DATA programmed in the fuse array 533 is transferred to the address determination unit 570.

The fuse driving unit 530 generates a control signal CTRL_SIG according to the fail information F_DATA programmed in the fuse array 533. The generated control signal CTRL_SIG is applied to the plurality of normal main word line selection units 540. Each of normal main word line selection units 540 having the fail information F_DATA receives the control signal CTRL_SIG having a low level. As the first NMOS transistor MN1 of the normal main word line selection unit 540 is deactivated in response to the control signal CTRL_SIG having a low level, a current path between the first node N1 and the ground voltage VSS is blocked.

In response to the control signal CTRL_SIG having a high level, the first NMOS transistor MN1 of the normal main word line selection unit 540 may be enabled to form a current path between the first node N1 and the ground voltage VSS. As such, the normal main word line selection unit 540 to which the control signal CTRL_SIG having a low level is applied is disabled, and the normal main word line selection unit 540 to which the control signal CTRL_SIG having a high level is applied is enabled and the normal main word line signal MWLB having a low level is outputted.

At this time, the local row address XADD is applied from outside and the address determination unit 570 determines whether or not the local row address XADD is identical to the fail information F_DATA.

When the address XADD applied from outside is identical to the fail information F_DATA, the address determination unit 570 activates the repair word line select signal XHIT having a high level. The activated repair word line select signal XHIT is applied to the mat selection unit 560 and the repair main word line selection unit 550. The 11th NMOS transistor MN11 of the repair main word line selection unit 550 may be enabled in response to the repair word line select signal XHIT having a high level, and then form a current path between the repair current sink 551 and the ground voltage VSS. The mat selection unit 560 outputs the mat select signal MATENB having a low level to the normal main word line selection unit 540 and the repair main word line selection unit 550 in response to the repair word line select signal XHIT having a high level and the bank select signal BKSEL. Since the fifth and sixth NMOS transistors MN5 and MN6 and the 12th and 13th NMOS transistors MN12 and MN13 are disabled, the current path between the power supply voltage VDD and the first node N1 within the normal main word line selection unit 540 is blocked, and the current path between the power supply voltage VDD and the third node N3 within the repair main word line selection unit 550 is blocked. Therefore, a current path between the third node N3 and the ground voltage VSS is formed in response to the repair word line select signal XHIT having a high level, and the repair main word line signal RMWLB having a low level is outputted.

The normal main word line selection unit 540 having the fail information F_DATA is disabled in response to the control signal CTRL_SIG having a low level. Thus, when the applied local row address XADD is identical to the fail information F_DATA, the repair main word line signal RMWLB is outputted to select a corresponding repair main word line in response to the repair word line select signal HIT.

The semiconductor memory device in accordance with the second embodiment of the present invention compares the local row address XADD with the fail information F_DATA, and generates the repair word line select signal XHIT to determine redundancy. At this time, since a normal main word line selection unit corresponding to the fail information F_DATA does not operate, the semiconductor memory device enables a repair main word line using the repair word line select signal XHIT. Since a delay time does not occur until a repair operation is performed, tRCD and tAA in the semiconductor memory device may be improved.

Figure 6:
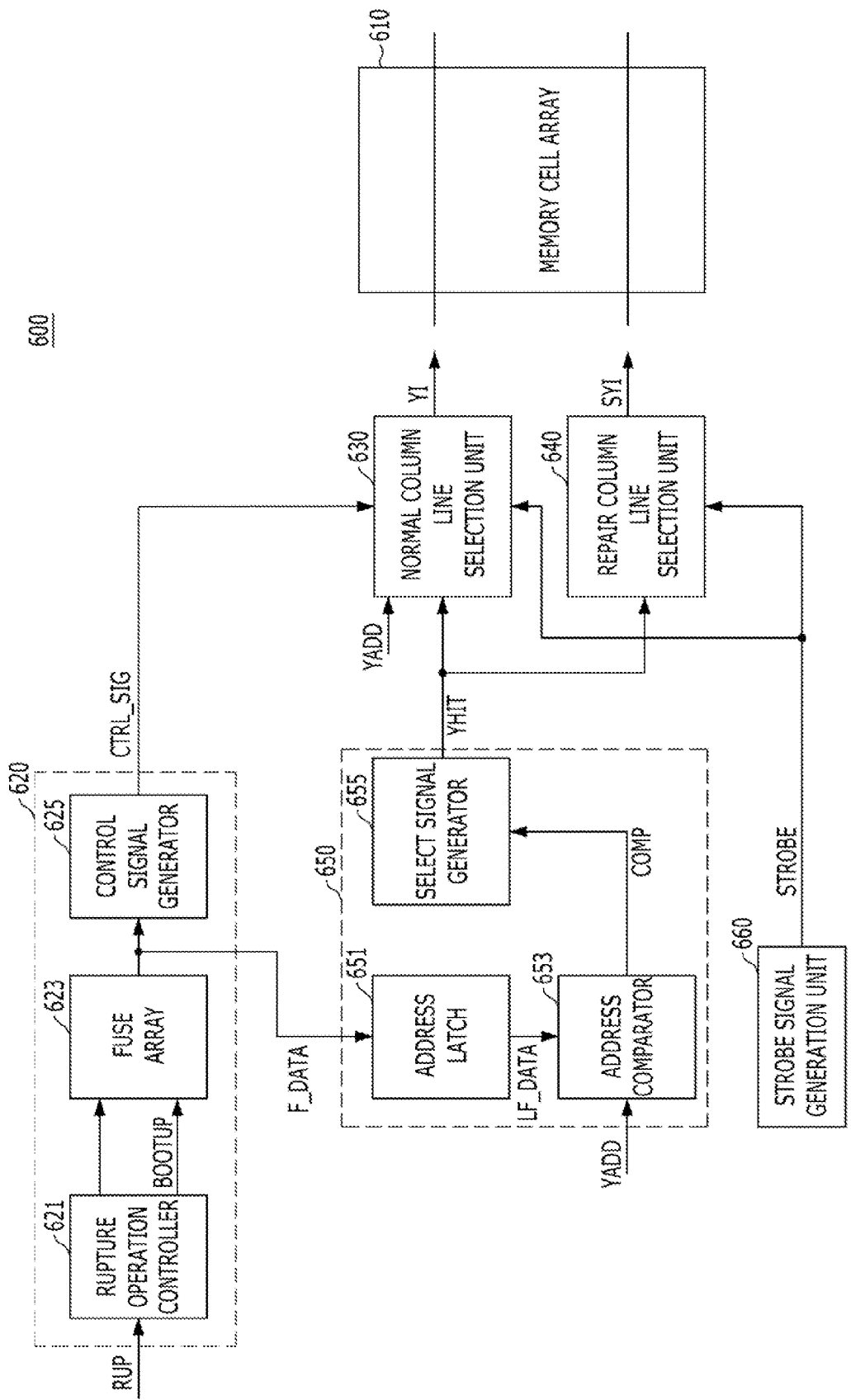
FIG. 6 is a block diagram illustrating a semiconductor memory device in accordance with a third embodiment of the present invention.

FIG. 6 is a block diagram illustrating a semiconductor memory device in accordance with a third embodiment of the present invention.

Referring to FIG. 6, the semiconductor memory device 600 includes a memory cell array region 610, a fuse driving unit 620, a plurality of normal column line selection units 630, a plurality of repair column line selection units 640, an address determination unit 650, and a strobe signal generation unit 660. The fuse driving unit 620 includes a rupture operation controller 621, a fuse array 623, and a control signal generator 625. Furthermore, the address determination unit 650 includes an address latch 651, an address comparator 653, and a select signal generator 655.

The third embodiment of the present invention relates to a column region which controls a bit line to load data into a bit line when a read or write command is applied from a memory controller (not shown).

The memory cell array region 610 includes a plurality normal column lines and a plurality of repair column lines.

The plurality of normal column line selection units 630 select the plurality of normal column lines respectively, within the memory cell array region 610 in response to a local column address YADD. The plurality of repair column line selection units 640 select the plurality of repair column lines, respectively, instead of normal column line selection units corresponding to fail information F_DATA of the local column address YADD among the plurality of normal column line selection units 630.

Furthermore, among the components of the fuse driving unit 620, the rupture operation controller 621 performs a rupture operation on the fuse array 623 in response to a rupture signal RUP applied when the semiconductor memory device 600 is booted. That is, through the rupture operation of the rupture operation controller 621, the fail information F_DATA is programmed into the fuse array 623. Then, as a boot-up signal BOOTUP is applied to the fuse array 623, a boot-up operation is performed. As a result, the fail information F_DATA programmed in the fuse array 623 is transferred to the address latch 651. After the boot-up operation, the control signal generator 625 generates a control signal CTRL_SIG to selectively control whether to enable and disable the plurality of column line selection units 630 in response to the fail information F_DATA programmed in the fuse array 623. At this time, when the plurality of normal column line selection units 630 are enabled, it may indicate that an operation of outputting a normal column select signal YI for selecting normal column lines corresponding to the local column address YADD is performed. Furthermore, when the plurality of normal column line selection units 630 are disabled, it may indicate that the operation of outputting the normal column select signal YI is not performed. Thus, normal column line selection units corresponding to the fail information F_DATA among the plurality of normal column line selection units 630 are disabled in response to the control signal CTRL_SIG. Furthermore, normal column line selection units unrelated to the fail information F_DATA are enabled in response to the control signal CTRL_SIG.

The address latch 651 of the address determination unit 650 receives the fail information F_DATA programmed in the fuse array 623 within the fuse driving unit 620, and latches the fail information F_DATA as latched fail information LF_DATA during the boot-up operation. When a read or write command is applied, the address comparator 653 compares the local column address YADD inputted from outside with the latched fail information LF_DATA, and outputs a comparison result COMP. Based on the comparison result COMP, the select signal generator 655 generates a repair column line select signal YHIT. The repair column line select signal YHIT is used to control the plurality of repair column line selection units 640 to select repair column lines when the local row address YADD coincides with the latched fail information LF_DATA. The repair column line select signal YHIT is applied to the normal column line selection units 630 and the repair column line selection units 640.

As such, the fuse driving unit 620 may recognize which of the normal column line selection units 630 is selected based on the fail information F_DATA programmed in the fuse array 623 during the boot-up operation. That is, the control signal generator 625 generates the control signal CTRL_SIG having a low level to disable normal column line selection units selected by the fail information F_DATA among the plurality of normal column line selection units 630. The control signal generator 625 generates the control signal CTRL_SIG having a high level to enable normal column line selection units which are not selected by the fail information F_DATA among the plurality of normal column line selection units 630. For reference, the low and high levels may be changed by a designer.

The strobe signal generation unit 660 generates a strobe signal STROBE after a read or write command is applied, and selects whether to enable and disable the normal column line selection units 630 and the repair column line selection units 640. Furthermore, since the normal column selection signal YI may control a plurality of banks (not illustrated) included in the memory cell array region 610, column lines of a corresponding bank are selected through the strobe signal STROBE and a bank address (not illustrated).

Specifically, an operation of the semiconductor memory device 600 will be described as follows.

First, during a boot-up operation, fail information F_DATA is transferred to the address latch 651 from the fuse array 623 in which the fail information F_DATA is programmed. At this time, while the fail information F_DATA is latched as latched fail information LF_DATA in the address latch 651, the control signal generator 615 outputs a control signal CTRL_SIG to enable and disable the plurality of normal column line selection units 630 in response to the fail information F_DATA stored in the fuse array 623. Thus, among the plurality of normal column line selection units 630, normal column line selection units corresponding to the fail information F_DATA stored in the fuse array 623 are disabled in response to the control signal CTRL_SIG, and the other normal column line selection units unrelated to the fail information F_DATA are enabled by the control signal CTRL_SIG.

Then, when a read or write command (not illustrated) for data input/output is applied from a memory controller (not illustrated), the local column address YADD is inputted from outside. The address comparator 653 compares the local column address YADD to the latched fail information LF_DATA latched in the address latch 651, and determines whether or not the local column address is identical to a fail address. When the local column address YADD coincides with the latched fail information LF_DATA, the select signal generator 655 generates a repair column select signal YHIT to control the plurality of repair column line selection units 640. At this time, since the normal column line selection units corresponding to the fail information F_DATA are disabled in response to the control signal CTRL_SIG the repair column line selection units 640 are driven immediately at the time at which the repair column select signal YHIT is generated. When the local column address YADD does not coincide with the fail information, the repair column select signal YHIT is deactivated. At this time, the normal column line selection units which do not correspond to the fail information F_DATA are enabled in response to the control signal CTRL_SIG. Thus, the normal column line selection units are driven to select normal column lines corresponding to the local column address YADD.

Figure 7:
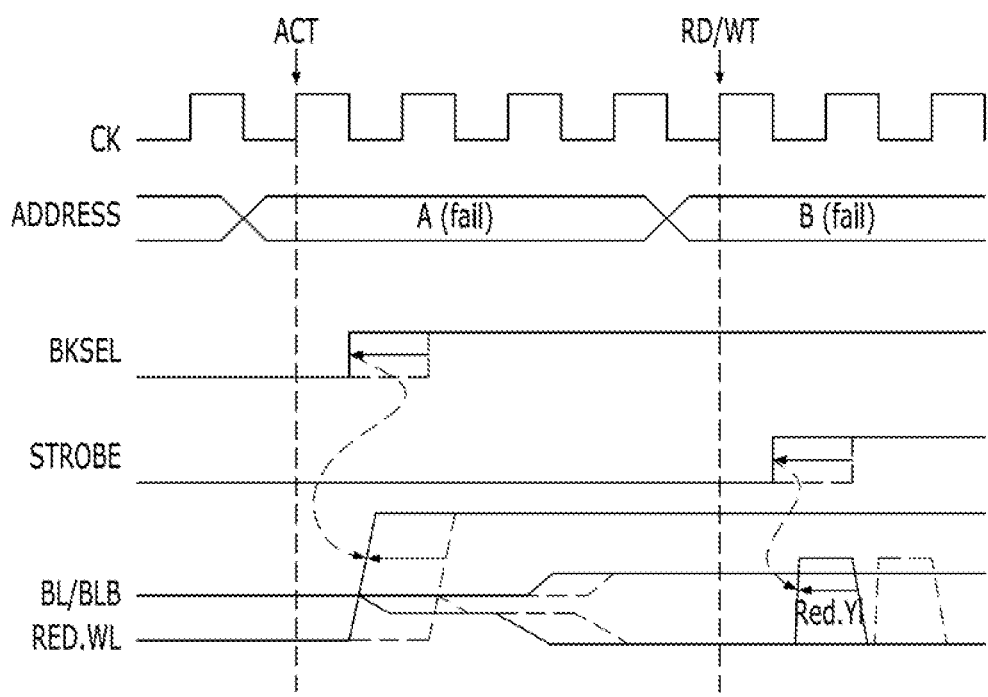
FIG. 7 is a timing diagram describing a repair operation of the semiconductor memory device shown in FIGS. 4 and 6.

FIG. 7 is a timing diagram describing a repair operation of the semiconductor memory devices shown in FIGS. 4 and 6.

Referring to FIG. 7, when an address A applied after an active command ACT, is identical to a fail address, a repair main word line Red.WL is enabled by the bank select signal BKSEL which is applied in a predetermined time after the active command ACT is applied. Furthermore, when an address B applied after a read or write command RD and WT is identical to a fail address, a repair column select signal Red.YI is activated by the strobe signal STROBE to be applied afterwards. Thus, the semiconductor memory devices in accordance with the exemplary embodiments of the present invention do not require first and second control signals NXKILL and NYKILL for determining whether to perform a repair operation in the conventional semiconductor device. The repair main word line signal Red.WL and the repair column select signal Red YI are not delayed by a predetermined time, but the repair operation may be performed immediately. Thus, it is possible to reduce the time required for the repair operation.

The semiconductor memory device in accordance with the exemplary embodiments of the present invention may control the plurality of normal cell line selection units for selecting normal cell lines using the fuse array having the fail information programmed therein. Thus, whether or not the local address applied from outside after a command is applied from the memory controller is identical to a fail address may be determined, and the repair operation is performed immediately when the repair select signal is activated. Therefore, it is possible to improve the time required for the repair time.

Furthermore, the positions and types of the logic gates and transistors included in the above-described embodiments may be set differently according to the polarity of input signals.

Although various embodiments have been described for illustrative purposes, it will be apparent to those skilled in the art that various changes and modifications may be made without departing from the spirit and scope of the invention as defined in the following claims.

What is claimed:

1. A semiconductor memory device comprising:
a plurality of normal mats selected by a plurality of normal main word lines, respectively;
a plurality of repair mats selected by a plurality of repair main word lines, respectively;
a plurality of normal main word line selection units suitable for selecting the plurality of normal main word lines, respectively, in response to a local row address;
a plurality of repair main word line selection units suitable for selecting the plurality of repair main word lines, respectively, in place of normal main word line selection units corresponding to fail information of the local row address among the plurality of normal main word line selection units;
a fuse driving unit comprising a fuse array in which the fail information is programmed, suitable for disabling the normal main word line selection units corresponding to the fail information, and enabling normal main word line selection units unrelated to the fail information; and
an address determination unit suitable for controlling the plurality of repair main word line selection units based on the fail information programmed in the fuse array,
wherein the plurality of normal main word line selection units are disabled in response to a control signal for disabling the plurality of normal main word line selection units, which is directly received from the fuse driving unit.

2. The semiconductor memory device of claim 1, wherein the fuse driving unit includes a control signal generator suitable for generating the control signal for selectively controlling whether to enable and disable the plurality of normal main word line selection units based on the fail information programmed in the fuse array.

3. The semiconductor memory device of claim 2, wherein the fuse driving unit further includes a rupture operation controller suitable for receiving a rupture signal and performing a rupture operation on the fuse array.

4. The semiconductor memory device of claim 2, wherein the address determination unit includes:
an address latch suitable for receiving the fail information programmed in the fuse array and latching the fail information during a boot-up operation;
an address comparator suitable for comparing the latched fail information with the local row address; and
a select signal generator suitable for generating a repair word line select signal for controlling the plurality of repair main word line selection units to select the plurality of repair main word lines when the local row address coincides with the fail information.

5. The semiconductor memory device of claim 4, further comprising:
a mat selection unit suitable for selecting whether to enable and disable the normal main word line selection units and the repair main word line selection units in response to a bank select signal, the repair word line select signal, and the local row address.

6. The semiconductor memory device of claim 5, wherein the mat selection unit generates a mat select signal for controlling the normal main word line selection units and the repair main word line selection units in response to the bank select signal and the repair word line select signal which are applied after an active command.

7. The semiconductor memory device of claim 5, wherein the mat selection unit drives the normal main word line selection units unrelated to the fail information when the repair word line select signal is deactivated, and drives the normal main word line selection units corresponding to the fail information when the repair word line select signal is activated.

8. The semiconductor memory device of claim 6, wherein each of the normal main word line selection units includes:
- a normal current sink suitable for performing a current sinking operation for selecting the corresponding normal main word line in response to the local row address, between the corresponding normal main word line and a ground voltage;
- a normal sink controller suitable for receiving the control signal to control the current sinking operation of the normal current sink; and
- a normal current source suitable for supplying a current to the normal current sink and the normal sink controller in response to the mat select signal, between a power supply voltage and the corresponding normal main word line.

9. The semiconductor memory device of claim 8, wherein each of the repair main word line selection units includes:
- a repair current sink suitable for receiving the power supply voltage and performing a current sinking operation between the corresponding repair main word line and the ground voltage;
- a repair sink controller suitable for controlling the current sinking operation of the repair current sink in response to the repair word line select signal; and
- a repair current source suitable for supplying a current to the repair current sink and the repair sink controller in response to the mat select signal, between the power supply voltage and the corresponding repair main word line.

10. The semiconductor memory device of claim 9, wherein a sinking timing of the repair current sink is synchronized with a sinking timing of the normal current sink.

* * * * *